(12) United States Patent
Costantini et al.

(10) Patent No.: US 6,612,317 B2
(45) Date of Patent: Sep. 2, 2003

(54) SUPERCRITICAL FLUID DELIVERY AND RECOVERY SYSTEM FOR SEMICONDUCTOR WAFER PROCESSING

(75) Inventors: Michael A. Costantini, Hudson, NH (US); Mohan Chandra, Merrimack, NH (US); Heiko D. Moritz, Nashua, NH (US); Ijaz H. Jafri, Nashua, NH (US); David J. Mount, North Andover, MA (US); Rick M. Heathwaite, Manchester, NH (US)

(73) Assignee: S.C. Fluids, INC, Nashua, NH (US)

( * ) Notice: Subject to any disclaimer, the term of this patent is extended or adjusted under 35 U.S.C. 154(b) by 181 days.

(21) Appl. No.: 09/837,507

(22) Filed: Apr. 18, 2001

(65) Prior Publication Data

US 2001/0050096 A1 Dec. 13, 2001

Related U.S. Application Data

(60) Provisional application No. 60/267,916, filed on Feb. 9, 2001, and provisional application No. 60/197,519, filed on Apr. 18, 2000.

(51) Int. Cl.[7] .................................................. B08B 3/10
(52) U.S. Cl. ....................... 134/58 R; 134/107; 134/108
(58) Field of Search ................................ 134/105, 107, 134/108, 57 R, 58 R, 56 R; 68/18 R, 18 C (56) References Cited

U.S. PATENT DOCUMENTS

| 5,071,485 A | | 12/1991 | Matthews et al. |
| 5,090,221 A | * | 2/1992 | Sewter et al. ............... 68/18 R |
| 5,261,965 A | | 11/1993 | Moslehi |
| 5,267,455 A | * | 12/1993 | Dewees et al. ......... 68/18 R X |
| 5,417,768 A | | 5/1995 | Smith, Jr. et al. |
| 5,494,526 A | | 2/1996 | Paranjpe |
| 5,505,219 A | | 4/1996 | Lansberry et al. |
| 5,509,431 A | | 4/1996 | Smith, Jr. et al. |
| 5,514,220 A | | 5/1996 | Wetmore et al. |
| 5,642,743 A | * | 7/1997 | Ranes ......................... 134/108 |
| 5,772,783 A | | 6/1998 | Stucker |
| 5,908,510 A | | 6/1999 | McCullough et al. |
| 5,996,155 A | * | 12/1999 | Chao et al. ............. 68/18 R X |
| 6,067,728 A | | 5/2000 | Farmer et al. |
| 6,085,935 A | | 7/2000 | Malchow et al. |
| 6,314,601 B1 | * | 11/2001 | McClain et al. ........ 68/18 R X |
| 6,442,980 B2 | * | 9/2002 | Preston et al. .......... 68/18 R X |

FOREIGN PATENT DOCUMENTS

| WO | WO99/49996 | 10/1999 |
| WO | WO99/49998 | 10/1999 |
| WO | WO 01/33615 A2 | 5/2001 |
| WO | WO 01/46999 A2 | 6/2001 |

OTHER PUBLICATIONS

U.S. patent application Ser. No. 60/197,519, Costantini et al., not yet published, priority document.
U.S. patent application Ser. No. 60/267,916, Costantini et al., not yet published, priority document.

* cited by examiner

Primary Examiner—Philip R. Coe
(74) Attorney, Agent, or Firm—Maine & Asmus (57) ABSTRACT

A continuous flow, steady state fluid delivery and recovery system for a process chamber and processes requiring supercritical fluid and desired additives including co-solvents, for conducting repetitive batch processing operations in an automated environment, for such processes as supercritical carbon dioxide cleaning and processing of semiconductor wafers. The system provides for steady-state operation of fluid flow and byproducts recovery while the process chamber is brought rapidly and repeatedly on and off line as in batch operations and for various process steps.

20 Claims, 4 Drawing Sheets

SUPERCRITICAL FLUID DELIVERY AND RECOVERY SYSTEM FOR SEMICONDUCTOR WAFER PROCESSING

This application relates and claims priority for all purposes to pending applications U.S. No. 60/197,519 filed Apr. 18, 2000 and U.S. No. 60/267,916 filed Feb. 9, 2001.

FIELD OF THE INVENTION

The invention relates to fluid delivery and recovery systems for the batch processing and cleaning with supercritical fluids, particularly to continuous flow, fluid delivery and recovery systems servicing a pressure vessel for supercritical phase cleaning and processing of semiconductor wafers as for removal of solvents, photo-resist materials, and loose particulate matter.

BACKGROUND OF THE INVENTION

The use of supercritical fluids is well known in the literature, and a number of patents have been granted that include both delivery and recovery systems for the associated fluids. The use of supercritical fluids for treating various mechanical and electrical components is also well known in the literature. Published work refers to treating semiconductor wafers with supercritical fluids, with and without co-solvents or surfactants, to clean, strip solvents or photo-resist resins, dehydrate, or otherwise treat the wafers or structures on the wafers. In some cases, cycling pressure between high and low limits is practiced to achieve particular process performance. Such processes are necessarily batch operated; a sample or unit portion of the materials under process, such as a single semiconductor wafer, being sealed in a pressure vessel and processed to completion.

The extent to which these wafer treatments are successful in industrial practice depends in part on the ability to carry them out reliably and economically. Ideally, continuous flow, steady-state operation of a supercritical fluid-handling system is desirable for stable process control, but some processes require that some time be allocated at the beginning or end or some point in the middle of the operation for discontinuous or unsteady state flow functions such as heating, cooling, pumping to fill and empty vessels, and increasing or decreasing system pressures.

Semiconductor wafer processing in a manufacturing environment involves multiple batch operations with high cycling rates. The repetitive sequence of process operations may be automated by robot manipulation of wafers in enclosed "cluster-tools" which interface to a number of process locations. Such automated systems require frequent loading and unloading of wafer process equipment, and require rapid cycling of pressures and temperatures in the process chambers if supercritical fluids are to be used.

Rapid cycling of fluid state or phase in a supercritical fluid process that involves, for example, rapid pressure changes, can lead to premature component failure due to the detrimental effects on seals, o-rings, and other wetted components made from polymers or elastomers. Extreme temperature changes associated with rapid pressure changes can cause valves and other components to freeze or fatigue, leading to unrecoverable system failure and costly downtime.

It is desirable, therefore, to provide a supercritical fluid delivery and recovery system that can operate at continuous flow, steady-state conditions, but can provide fluid to, and receive fluid and process byproducts from, a repetitive batch operation process that requires high-cycling and highly variable process conditions. It is also desirable to provide for automation of the fluid supply and recovery system and process chamber as in an automated wafer-factory as described above.

SUMMARY OF THE INVENTION

The invention, simply stated, is a continuous flow, steady state fluid delivery and recovery system for a process chamber requiring supercritical fluid and desired additives including co-solvents, for conducting repetitive batch processing operations in an automated environment. The delivery and recovery system provides for steady-state operation of fluid flow and byproducts recovery while the process chamber is brought rapidly and repeatedly on and off line, as in a production line operation where articles under process are sequentially loaded, subjected to a process that includes one or more supercritical phase steps, and unloaded for the next batch of materials under process.

It is an objective of the invention to provide embodiments that can be used with carbon dioxide, but the invention can be applied equally well with other gases. It is a further objective to provide for the ability to connect or isolate the process chamber at inlets and outlets with an automated valve system for rapid filling, exchanging, and purging of process fluids, with the capability of rapid cycling of pressure for rapid compression and/or decompression effects on the materials under process. It is another objective to provide a heating and cooling capacity that can be quickly applied to the process chamber for relatively fast temperature changes and tight temperature control of the process environment during repetitive batch processing operations, while providing for continuous flow, steady state operation of the fluid supply and recovery system.

It is yet another objective to provide the system elements necessary to operate in an automated mode for extended periods of operation, enabling repetitive process cycles to be completed as in production line fashion without operator intervention. It is still another objective to enable the system and chamber combination to be part of a larger manufacturing system or operation for processing semiconductor wafers.

It is an additional objective to provide a means for feeding the process chamber with process fluid, selectively with or without an additive such as a co-solvent, being already at the desired temperature and pressure, including at supercritical phase where desirable, without a delay period for purging the additive from intermediate devices, during repetitive batch processing operations, while providing for continuous flow, steady state operation of the fluid supply and recovery system.

It is a still additional objective of the invention to provide process chamber inlet and outlet fluid pressurization and flow capabilities sufficient for applying very rapid compression or decompression as intra-phase or inter-phase events to the materials under process within the chamber during repetitive batch processing operations, while providing for continuous flow, steady state operation of the fluid supply and recovery system. Intra-phase pressure and/or temperature changes would, for example, retain the process chamber fluids in the present phase, such as in supercritical phase; whereas inter-phase changes might move the fluids from supercritical phase to gas phase, or gas to liquid phase or state.

The invention includes a process fluid supply system, generally stored initially as a gas, and a supply system for co-solvent and/or surfactant for the process fluid, referred to as co-solvent. It includes a means to condense a process gas to a liquid, and a system to pump the condensed gas and co-solvent at high-pressure, mix them together, and heat them to supercritical state for delivery to a process chamber, or series of chambers. It may include one or more ballast tanks to provide a pressurized volume of the process-ready fluid mixture for applying rapid compression effects to the process chamber at supercritical phase or lower pressure levels. It may include special provisions for outflow capacity from the process chamber for applying rapid decompression effects to the chamber at supercritical phase or lower pressure levels. A bypass line with isolation valves allows for conducting a process cycle in the process chamber, including temperature and pressure ranging within the process chamber, independent of a steady state fluid circulation maintained within the supply and recovery system.

The gas supply system may include a bulk storage tank, filter, condenser, pressurized receiver tank, and delivery pump. The delivery pump can independently feed two or more supply lines to the chamber, one or more containing a process fluid and co-solvent mixture, and one with process fluid without co-solvent. The co-solvent supply system may include one or more bulk supply tanks, receivers, and delivery pumps.

The invention includes a recovery system to collect the process byproducts and purify the gas and liquid and return them to their respective receiver tanks, and a means to collect and remove process waste for appropriate disposition. The recovery system may consist of one or more flash separators to separate the gas from the liquid, a distiller/evaporator to re-distill the co-solvent, and a condenser to condense the co-solvent vapors to liquid.

The invention includes various pressure, temperature, and level transmitters, manual and automatic control valves, check valves, relief valves, rupture disks, and interconnecting piping and other hardware necessary to operate the process safely and effectively. The invention may be controlled by a digital controller in a control panel with appropriate user interface and display of information necessary for an operator to control and monitor the system.

The invention extends to and is inclusive of a gas supply system and separate supply systems for co-solvent and surfactant. It may include a means to condense the gas to a liquid, and a system to pump the condensed gas at high-pressure, mix it with co-solvent and surfactant in individual mixing tanks, and heat them to supercritical state for delivery through a ballast tank system or directly to a process chamber, or series of chambers. A bypass line with isolation valves allows repetitive batch operations of the process chamber independent of continuous fluid circulation in the supply and recovery system.

The gas supply system includes a bulk storage tank, filter, condenser, pressurized receiver tank, delivery pump, and discharge chamber. The delivery pump may independently feed three or more supply lines, leading to each of three or more ballast or discharge chambers. One discharge chamber may contain co-solvent, one may contain surfactant, and one may contain neither co-solvent nor surfactant. The co-solvent and surfactant supply systems may each include a bulk supply tank, receiver, and a delivery pump.

The invention services or may include one or more batch operated process chambers, and has the capacity to support, monitor and control internal chamber heaters or heat exchanger coils which have very rapid heating and cooling capacity, so as to provide full in-chamber process temperature control in addition to the pressure control provided by the fluid supply and recovery system.

The invention includes a recovery system to collect, separate and purify the byproduct gas, co-solvent, and surfactant and return them to their respective receiver tanks, and to collect and remove process waste for appropriate disposition. The recovery system may consist of a flash separator to separate the gas from the liquid, and two distiller/evaporators in series to re-distill the co-solvent and surfactant, and condensers to condense the co-solvent and surfactant vapors to liquid for return to their respective receivers.

A process chamber discharge receiver may be included to accept process chamber discharge during any rapid decompression steps which may occur during the process cycle. The receiver contents are vented into the recovery system for recycle.

The invention includes pressure, temperature, and level transmitters, manual and automatic control valves, check valves, relief valves, rupture disks, and interconnecting piping and other hardware necessary to operate the process safely and effectively. The invention may be controlled by a digital controller in a control panel with appropriate user interface and display of information necessary for an operator to interface with the system.

In summary, the invention combines broad temperature and pressure control of a batch operated supercritical process chamber, with full control of the associated, automated, continuous flow fluid supply and recovery control system, providing an integrated, full supercritical process operating system that can be integrated into a larger, automated, manufacturing system with front end and back end machinery and processes.

Still other objects and advantages of the present invention will become readily apparent to those skilled in this art from the following detailed description, wherein we have shown and described only preferred embodiments of the invention, simply by way of illustration of the best mode contemplated by us on carrying out our invention. As will be realized, the invention is capable of other and different embodiments, and its several details are capable of modifications in various obvious respects, all without departing from the invention.

DETAILED DESCRIPTION OF A FIRST PREFERRED EMBODIMENT

Figure 1:
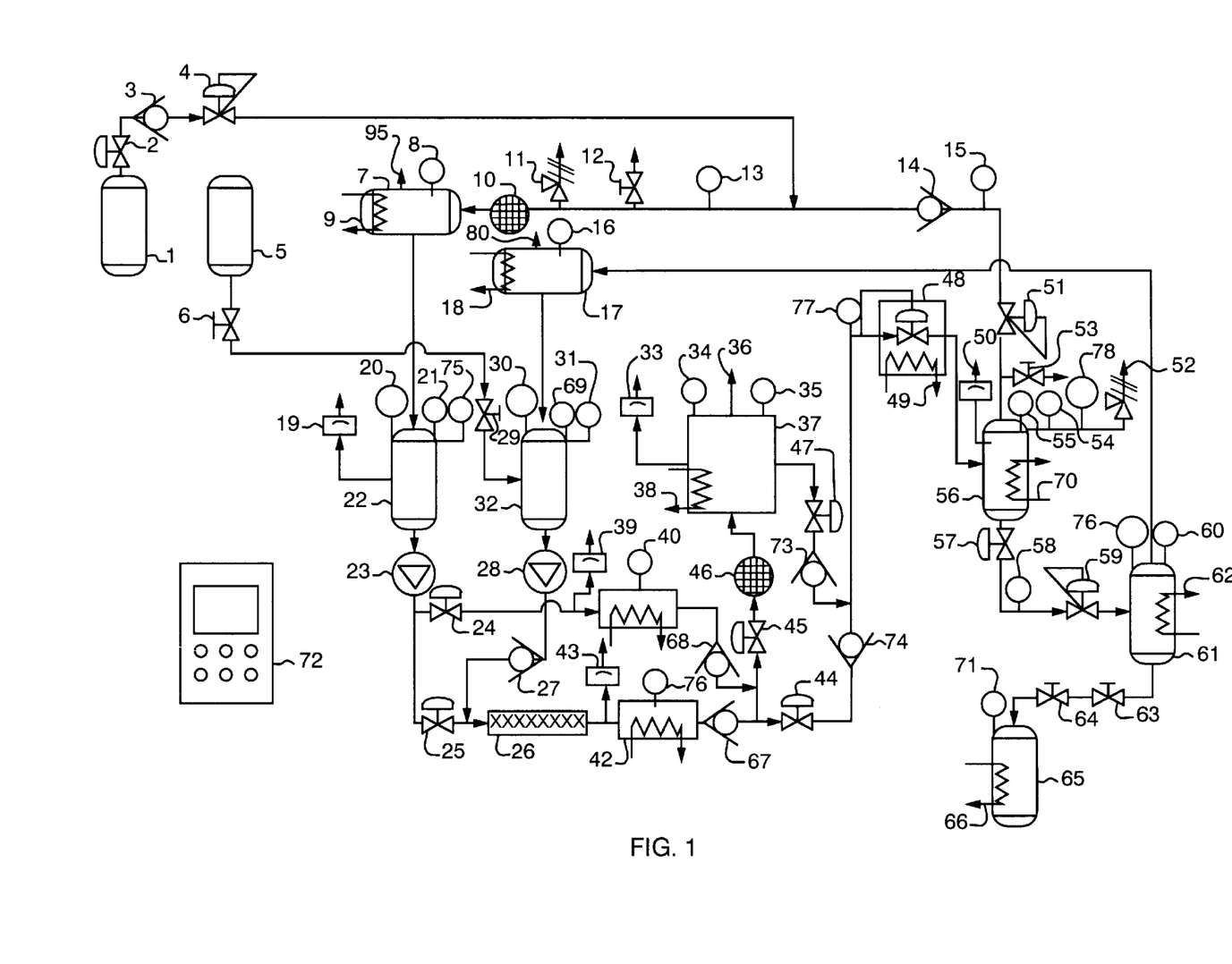
FIG. 1 is a diagrammatic presentation of a first embodiment of a delivery and recovery system of the invention.

The invention is susceptible of various other embodiments in addition to the descriptions of preferred embodiments that follow. Referring to FIG. 1, pressurized gas or gas mixture from tank 1 is fed by valve 2 through check valve 3 and controlled by valve 4 to the desired downstream pressure, which is measured by pressure transmitter 13. A manual valve 12 allows venting or sampling of the gas as needed. Over-pressure protection is provided by pressure relief valve 11. Filter 10 removes impurities, solute, solvent, water, or other contamination, dirt, or particles to a predetermined level necessary for correct process performance.

The gas is condensed to a liquid in condenser 7 at a temperature determined by the chiller 9 and monitored by temperature transmitter 8. Non-condensable gases are vented at vent 95. The liquid is stored in receiver tank 22, which is monitored by pressure transmitter 21, level transmitter 20 and temperature transmitter 75, and protected with rupture disk 19. The liquid, now called solvent, is pressurized by feed pump 23 to a predetermined value above its critical pressure, although it is still a liquid, and is fed through valves 25 where it is mixed with co-solvent, or, if co-solvent is not required, through valve 24. When the solvent is fed through valve 25, valve 24 remains closed. When solvent is fed through valve 24, valve 25 remains closed.

In the case where the feed pump feeds through valve 25, the solvent is mixed in a simple tee with a liquid co-solvent, to form a mixture. The co-solvent is dispensed from a vessel 5 through valves 6 and 29 to vessel 32, which is monitored by level transmitter 30, temperature transmitter 69, and pressure transmitter 31. Vessel 5 is isolated from vessel 32 by valves 6 and 29, which allow vessel 5 to be connected and disconnected from vessel 32 as needed to insure a sufficient quantity of co-solvent exists in vessel 32. Valves 6 and 29 may be manual valves, automatic valves, or other means of isolation, such as plugs, caps, or other means as needed to provide isolation, and vessel 32 may be replenished by other means.

The co-solvent is pumped by co-solvent pump 28, at a sufficient pressure to pass through check valve 27, to mix with the solvent in a simple tee. The mixture passes through static mixer 26, which causes the solvent and co-solvent mixture to become more intimately mixed.

The mixture is fed through heater 42, protected by rupture disk 43, and monitored by temperature transmitter 76, which raises the temperature of the mixture to a predetermined value above its critical temperature. The mixture is fed through check valve 67 and control valve 45, through filter 46, which removes impurities to a predetermined level necessary for process performance, and into process chamber 37.

Process chamber 37 is protected by rupture disk 33, monitored by temperature transmitter 34 and pressure transmitter 35, and heated and cooled by heater-cooler 38. The mixture in process chamber 37 performs the intended process function, such as cleaning, or stripping, and exits the chamber through control valve 47 and check valve 73 into a recovery section described below.

During some periods of time, the inlet and outflow control valves of process chamber 37 are closed. The chamber is not available for receiving the mixture, either because it is off-line and open for accepting a new batch or removing the current batch of process material, or it is undergoing a timed process function that requires it be isolated. This condition we call "off-line" with respect to the supply and recovery system.

When process chamber 37 is off-line, isolation valves 45 and 47 will be closed, and bypass valve 44 will open. The mixture passes through bypass valve 44 and check valve 74 into a recovery section described below. The use of isolation valves 45 and 47, and bypass valve 44, in this way, allows the delivery and recovery system to remain in operation with continuous fluid circulation until the process chamber is brought back "online".

In the case where no co-solvent is required for the process, feed pump 23 pumps solvent through valve 24, and through heater 41. Heater 41 is protected by rupture disk 39, and monitored by temperature transmitter 40. Heater 41 raises the temperature of the solvent to a predetermined value above its critical temperature. The solvent fed through check valve 68 and control valve 45, through filter 46 which removes impurities to a predetermined level necessary for process performance, into process chamber 37.

The recovery section is fed a solvent or mixture that may be above its critical temperature and pressure, either through valve 44 or as discharged from process chamber 37, through valve 47 as described above; its pressure monitored by pressure transmitter 77. The recovered solvent or mixture may contain suspended or dissolved components from process chamber 37, and is now called "effluent". The effluent passes through back-pressure control valve 48, which is heated as needed to control temperature or prevent condensation, by heater 49, which controls the back-pressure to a predetermined value.

The effluent passes into separator 56, which is protected by rupture disk 50, pressure-relief valve, 52, and is monitored by level transmitter 78, temperature transmitter 55, and pressure transmitter 54. In separator 56, the pressure is controlled by back-pressure control valves 51 and 59, to a predetermined pressure below the critical pressure of the effluent. The temperature falls below the critical temperature of the effluent, but is maintained above a predetermined minimum temperature to prevent sub-cooling, condensation, or other undesirable condition by heater 70. Under the temperature and pressure conditions just described, the effluent separates into a vapor phase and a liquid phase.

The vapor phase contains the gas or gas mixture originally supplied by feed pump 23, and a small fraction of co-solvent or dissolved liquid or solid from the wafer in process chamber 37, based on its solubility in the gas under the conditions in the separator. The separated gas passes through valve 51, through check-valve 14, its pressure monitored by pressure transmitter 15, and combines with gas supplied by tank 1, as described above. A valve 53 is provided for venting or sampling as needed, at the discretion of the operator.

The liquid-phase contains the co-solvent and any dissolved or suspended components removed in process chamber 37, and a small fraction of gas, based on the solubility of the gas in the co-solvent, under the conditions in the separator. The liquid phase is drained from the separator through control valve 57, its pressure monitored by pressure transmitter 58 and controlled by back-pressure control valve 59 to maintain the desired pressure in separator 56.

The liquid phase passes into separator 61, monitored by level transmitter 79, temperature transmitter 60, and heated by heater 62. Heater 62 heats the liquid phase to boiling at atmospheric pressure, to provide for separation into a vapor-phase containing the co-solvent, at suitable purity to be re-used in the process previously described, and a liquid-phase containing any remaining contamination, and sufficient liquid, if any, needed to maintain a fluid state. The liquid phase is now called waste.

The waste is discharged as needed through isolation valves 64 and 63 to holding tank 65, which is cooled by chiller 66 and monitored by temperature transmitter 71 to ambient conditions. Tank 65 is removed for disposal or recovery of its contents as needed by closing isolation valves 63 and 64 and disconnecting the line between them.

The vapor phase from separator 61 passes into condenser 17, which is vented 80, monitored by temperature transmitter 16 and cooled by chiller 18, and which condenses the vapor into liquid co-solvent which flows by gravity into co-solvent tank 32.

Optionally or alternatively, there may be included a heated ballast tank on the inlet side of chamber 37 with a switchable supply inlet for admitting a solvent or solvent/co-solvent mixture into the ballast tank, and a switchable outlet that provides for rapid inflow of the ballast tank contents into chamber 37 or into bypass line for directing ballast tank contents into the recovery side of the system when the chamber is off-line. The heated ballast tank with switchable connection to chamber 37 provides a reservoir of fluid mixture at supercritical phase temperature and pressure that enables the application of a pulse-like very rapid injection and compression of supercritical fluid into the process cavity of chamber 37, while the bypass capability permits continuous fluid circulation in the supply and recovery system; the ballast tank being gradually recharged between batch processing cycles.

Where the process requires very rapid decompression and expulsion of supercritical fluid from chamber 37, there may be provided a valve and suitable receiver volume as described in the FIG. 2 embodiment below.

All transmitters referred to above provide a signal to control panel 72, which contains a digital process controller, programmable logic controller, or other means of providing control logic to control the process. Control panel 72 provides a means for an operator to view the equivalent numerical value of the signal from each transmitter, and provides, through pre-programmed logic, whatever signal is required to actuate the particular control valves and pumps described above to control the process.

In the case of pressure control valves, they may be analog control valves that provide an internal means to control back-pressure or downstream pressure to a preset value without relying on the control panel. Control Panel 72 provides a means to intervene and/or shut down the system in the event of a pre-programmed safety-interlock violation, or other prohibited condition.

All rupture disks, relief valves, or vents discharge to a manifold connected to an appropriate collection system to be handled according to the hazardous nature of the particular components and the governing law for the location of the system.

FIG. 1 is drawn showing a single process chamber 37. It will be readily evident to those skilled in the art that the system may support multiple process chambers in a parallel piping arrangement, with the addition of the necessary isolation valves and chamber-specific components.

FIG. 1 is drawn showing a single co-solvent/surfactant supply and recovery. It will be evident to those skilled in the art that the invention will accommodate multiple co-solvent/surfactant supply and recovery steps incorporated in series or parallel to provide addition and separation of co-solvent/surfactants, according to the defined process procedure and temperature and pressure at which each component will separate.

Figure 2:
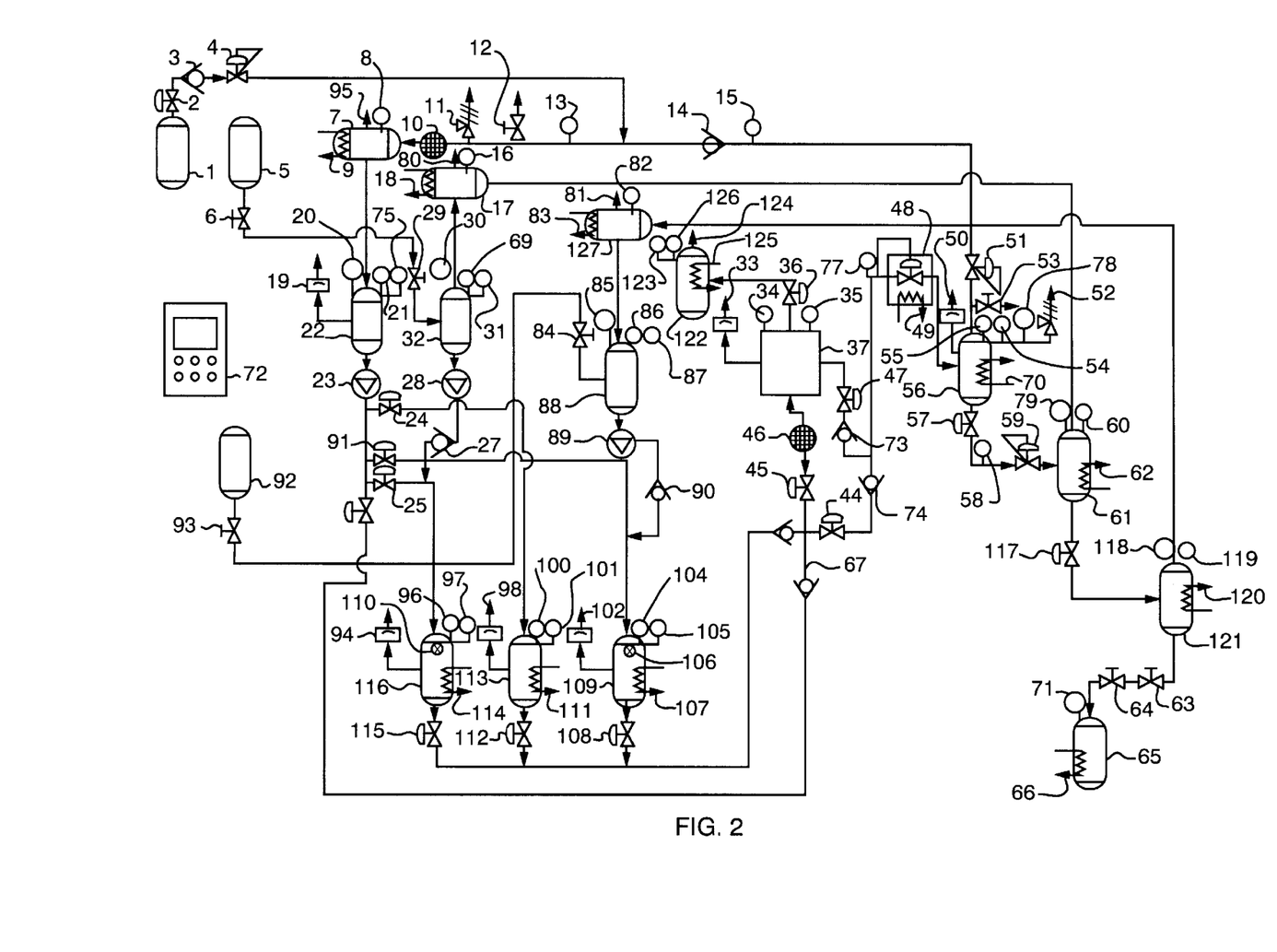
FIG. 2 is a diagrammatic presentation of a second embodiment of a delivery and recovery system of the invention.

Referring to FIG. 2, there is illustrated an extension of the first embodiment, for incorporating liquid surfactants into the fluid mixture supply side, and addressing them on the recovery side of the system. Similar to the first embodiment, pressurized gas or gas mixture from tank 1 is fed by valve 2 through check valve 3 and controlled by valve 4 to the desired downstream pressure, which is measured by temperature transmitter 13. A manual valve 12 allows venting or sampling of the gas as needed. Over-pressure protection is provided by over-pressure valve 11. Filter 10 removes impurities, solute, solvent, water, or other contamination, dirt, or particles to a predetermined level necessary for correct process performance.

The gas is condensed to a liquid in condenser 7 at a temperature determined by the chiller 9 and monitored by temperature transmitter 8. Non-condensable gases are vented at vent 95. The liquid is stored in receiver tank 22, which is monitored by pressure transmitter 21, level transmitter 20 and temperature transmitter 75, and protected with rupture disk 19. The liquid, now called solvent, is pressurized by feed pump 23 to a predetermined value above its critical pressure, although it is still a liquid, and is fed through valve 25 where it is mixed with co-solvent, or, if co-solvent is not required, through valve 24. If surfactant is required, the solvent is fed through valve 91. When the solvent is fed through valve 25, valves 24 and 91 remain closed. When solvent is fed through valve 24, valves 25 and 91 remain closed. When the solvent is fed through valve 91, valves 24 and 25 remain closed.

In the case where the feed pump feeds through valve 25, the solvent is mixed in a simple tee with a liquid co-solvent, to form a mixture. The co-solvent is dispensed from a vessel 5 to vessel 32, which is monitored by level transmitter 30, temperature transmitter 69, and pressure transmitter 31. Vessel 5 is isolated from vessel 32 by valves 6 and 29, which allow vessel 5 to be connected and disconnected from vessel 32 as needed to insure a sufficient quantity of co-solvent exists in vessel 32.

The co-solvent is pumped by co-solvent pump 28, at a sufficient pressure to pass through check valve 27, to mix with the solvent in a simple tee. The mixture passes through mixer 110, which causes the solvent and co-solvent mixture to become more intimately mixed. Mixer 110 is a static mixer, mixing nozzle, or other means to mix the components without the need for bearing surfaces which will generate contaminating particles.

The mixture enters tank 116, which is monitored by temperature transmitter 97, and pressure transmitter 96, and protected with rupture disk 94, where it is heated to supercritical temperature by heater 114. The mixture, at a predetermined time, is rapidly discharged through control valve 15, check valve 67 and control valve 45, through filter 46, which removes impurities to a predetermined level necessary for process performance, and into process chamber 37.

In the case where the feed pump feeds through valve 91, the solvent is mixed in a simple tee with a liquid surfactant, to form a mixture. The surfactant is dispensed from a vessel 92 to vessel 88, which is monitored by level transmitter 85, temperature transmitter 86, and pressure transmitter 87. Vessel 92 is isolated from vessel 88 by valves 93 and 84, which allow vessel 92 to be connected and disconnected from vessel 88 as needed to insure a sufficient quantity of surfactant exists in vessel 88.

The surfactant is pumped by surfactant pump 89, at a sufficient pressure to pass through check valve 90, to mix with the solvent in a simple tee. The mixture passes through mixer 106, which causes the solvent and surfactant mixture to become more intimately mixed. Mixer 106 is a static mixer, mixing nozzle, or other means to mix the components without the need for bearing surfaces which will generate contaminating particles.

The mixture enters tank 109, which is heated to supercritical temperature by heater 107, monitored by temperature transmitter 104, and pressure transmitter 105, and protected with rupture disk 102. The mixture, at a predetermined time in the batch process, is rapidly discharged through control valve 108, check valve 67 and control valve 45, through filter 46, which removes impurities to a predetermined level necessary for process performance, and into process chamber 37.

In the case where the feed pump feeds through valve 24, the solvent enters tank 113, which is heated to supercritical temperature by heater 111, monitored by, temperature transmitter 100, and pressure transmitter 101, and protected with rupture disk 98. The solvent, at a predetermined time, is rapidly discharged through control valve 112, check valve 67 and control valve 45, through filter 46, which removes impurities to a predetermined level necessary for process performance, and into process chamber 37.

Process chamber 37 is protected by rupture disk 33, monitored by temperature transmitter 34 and pressure transmitter 35, and heated and cooled by heater-cooler 38. The solvent or mixture in process chamber 37 performs the process function, such as cleaning, or stripping, for which it was intended, and exits the chamber through control valve 47 and check valve 73 into a recovery section described below.

During process steps where the process chamber will be subjected to rapid decompression, the decompression exhaust will take place through valve 36, the chamber contents vented into receiver 122. Receiver 122 is monitored by temperature transmitter 123, pressure transmitter 126, and heated by heater 125. Receiver 122 is vented through vent 124.

During some periods of time all inlet and outlet valves for process chamber 37 are closed. The chamber is off-line and not available for receiving the mixture, either because it is open for accepting the next batch or removing the current batch of process material, or it is undergoing a timed process function that requires it be isolated.

When the process chamber is off-line, isolation valves 45 and 47 will be closed, and bypass valve 44 will open. The mixture passes through bypass valve 44 and check valve 74 into a recovery section described below. The use of isolation valves 45 and 47, and bypass valve 44, in this way, allows the delivery and recovery system to maintain circulation, maintaining appropriate temperatures and pressures at steady state until the process chamber is no longer off-line.

The recovery section is fed a solvent or mixture above its critical temperature and pressure, discharged from process chamber 37, through either valve 44 or valve 47 as described above, its pressure monitored by pressure transmitter 77. The solvent or mixture may contain suspended or dissolved components from process chamber 37, and is now called "effluent". The effluent passes through back-pressure control valve 48, which is heated as needed to control temperature or prevent condensation, by heater 49, which controls the back-pressure to a predetermined value.

The effluent passes into separator 56, which is protected by rupture disk 50, pressure-relief valve, 52, and is monitored by level transmitter 78, temperature transmitter 55, and pressure transmitter 56. In separator 56, the pressure is controlled by back-pressure control valves 51 and 59, to a predetermined pressure below the critical pressure of the effluent. The temperature falls below the critical temperature of the effluent, but is maintained above a predetermined minimum temperature to prevent sub-cooling, condensation, or other undesirable condition by heater 70. Under the temperature and pressure conditions just described, the effluent separates into a vapor phase and a liquid phase.

The vapor phase contains the gas or gas mixture originally supplied by feed pump 23, and a small fraction of co-solvent/surfactant or dissolved liquid or solid from the wafer in process chamber 37, based on its solubility in the gas under the conditions in the separator. The separated gas passes through valve 51, through check-valve 14, its pressure monitored by pressure transmitter 15, and combines with gas supplied by tank 1, as described above. A valve 53 is provided for venting or sampling as needed, at the discretion of the operator.

The liquid-phase contains the co-solvent, surfactant, and any dissolved or suspended components removed in process chamber 37, and a small fraction of gas, based on the solubility of the gas in the co-solvent/surfactant mixture, under the conditions in the separator. The liquid phase is drained from the separator through control valve 57, its pressure monitored by pressure transmitter 58 and controlled by back-pressure control valve 59 to maintain the desired pressure in separator 56.

The liquid phase passes into separator 61, monitored by level transmitter 79, temperature transmitter 60, and heated by heater 62. Heater 62 heats the liquid phase to boiling at atmospheric pressure, to provide for separation into a vapor-phase containing the co-solvent, at suitable purity to be re-used in the process previously described, and a liquid-phase containing the surfactant and any remaining contamination.

The liquid phase passes through control valve 117, into separator 121, monitored by level transmitter 118, temperature transmitter 119, and heated by heater 120. Heater 120 heats the liquid phase to boiling at atmospheric pressure, to provide for separation into a vapor-phase containing the surfactant, at suitable purity to be re-used in the process previously described, and a liquid-phase containing any remaining contamination, and sufficient liquid, if any, needed to maintain a fluid state. The liquid phase is now called waste.

The waste is discharged as needed through isolation valves 64 and 63 to holding tank 65, which is cooled by chiller 66 and monitored by temperature transmitter 71 to ambient conditions. Tank 65 is removed for disposal or recovery of its contents as needed by closing isolation valves 63 and 64 and disconnecting the line between them.

The vapor phase from separator 61 passes into condenser 17, which is vented 80, monitored by temperature transmitter 16 and cooled by chiller 18, and which condenses the vapor into liquid co-solvent which flows by gravity into co-solvent tank 32.

The vapor phase from separator 121 passes into condenser 127, which is vented 81, monitored by temperature transmitter 82 and cooled by chiller 83, and which condenses the vapor into liquid surfactant, which flows by gravity into surfactant tank 88.

As in the first embodiment, there may be included a heated ballast tank and bypass capability for applying a pulse-like rapid injection and compression of a selected supercritical fluid mixture into the process cavity of chamber 37, while permitting steady state operation of the supply and recovery system.

As in the embodiment of FIG. 1, all transmitters referred to in the FIG. 2 embodiment provide a signal to control panel 72, which provides the same general functionality as in the first embodiment. Again as in the first embodiment, all rupture disks, relief valves, or vents discharge to a manifold which is connected to the recovery system flash separator 56, to be processed for recovery, or into an appropriate waste disposal container or destruct unit. Also as in the first embodiment, the supply and recovery system of FIG. 2 may support multiple process chambers.

Figure 3:
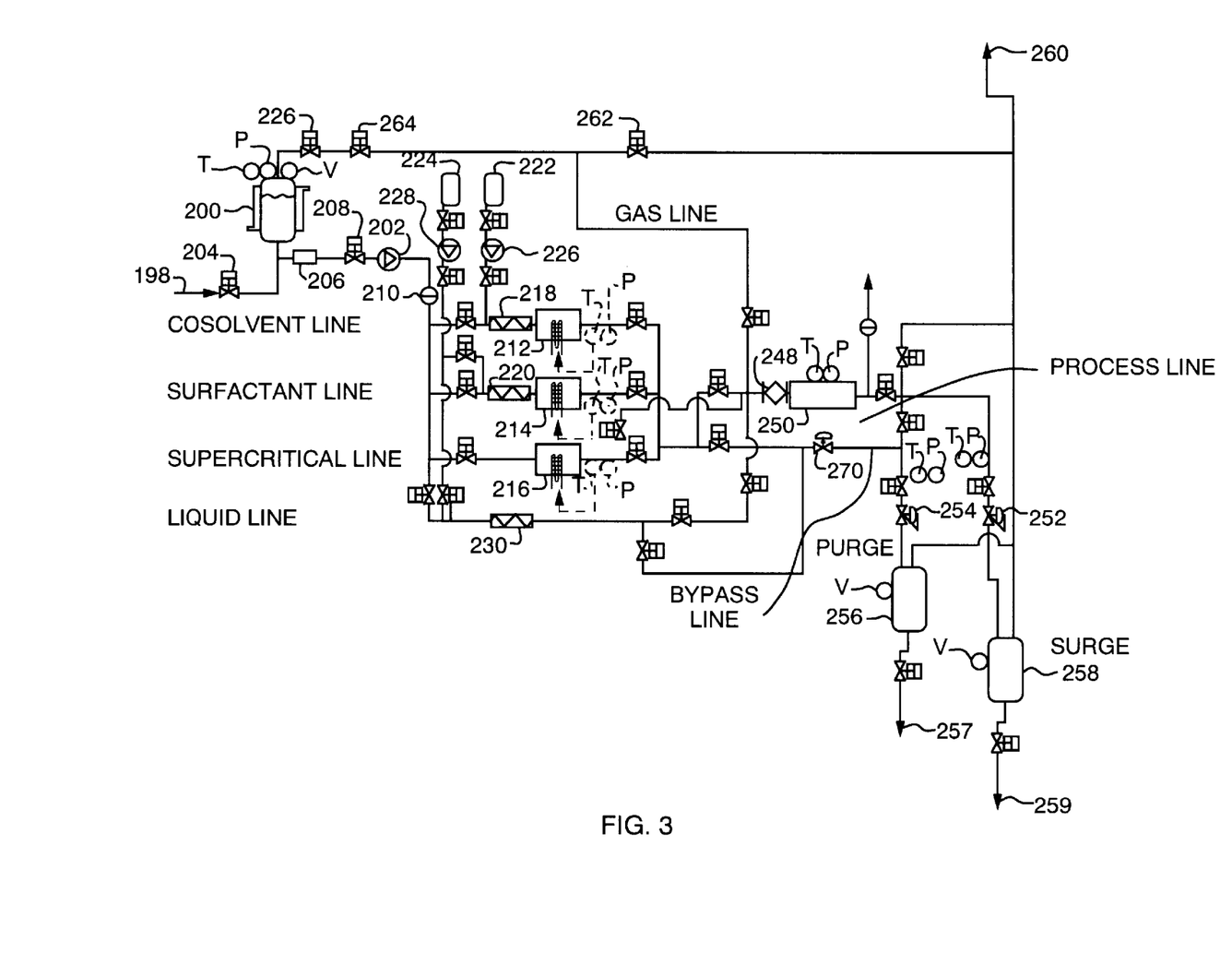
FIG. 3 is a diagrammatic presentation of a third embodiment of a delivery and recovery system of the invention.

Referring now to FIG. 3, there is illustrated a continuous flow, steady state $CO_2$ (carbon dioxide) delivery system designed to supply $CO_2$, and $CO_2$ mixed with additives, to a process vessel used for conducting a supercritical process in repetitive batch operations where the chamber is periodically offline for particular process steps or for unloading/ loading operations for the next batch. The $CO_2$ can be selectively supplied to the chamber as gas, liquid, and supercritical fluid. Additives can be added to the liquid and supercritical phase sources of the $CO_2$.

The general process flow in FIG. 3 is from the upper left to the lower right. $CO_2$ is stored in storage tank 200 that is kept at a constant temperature to establish and maintain a constant working pressure, which defines the input pressure of pump 202. Storage tank 200 is equipped with a liquid level sensor that controls the fill level of the tank. The storage tank is recharged from a $CO_2$ bulk supply 198 through refill valve 204. Above the liquid level in storage tank 200, $CO_2$ is available as gas with a pressure determined by the temperature of the liquid $CO_2$. The temperature in the tank ideally is kept at constant temperature.

The supply of liquid $CO_2$ flows through flow meter 206 and main liquid feed valve 208 to pump 202. Pump 202 generates the $CO_2$ process flow while a backpressure valve 252 on the downstream side of process chamber 250 generates the process pressure. The $CO_2$ flow rate is monitored by flow meter 206 located on the inlet side of pump 202. In steady state condition the measured flow at flow meter 206 is equal to the flow through the process chamber.

Process pressure and flow rate through process chamber 250 can be varied by varying the setting of backpressure valve 252 and the pumping speed of pump 202. To increase the flow, backpressure valve 252 has to be opened, which, at constant pumping speed would drop the pressure. In order to compensate for this the pumping speed of pump 202 has to be increased resulting in an increase of the flow rate. An electronic control system is used to manage the settings of pump 202 and backpressure valve 252.

There are five supply lines available to charge process chamber 250: (i) GAS LINE, (ii) COSOLVENT LINE, (iii) SURFACTANT LINE, (iv) SUPERCRITICAL LINE, and the (v) LIQUID LINE. Particle filter 248 and process chamber 250 and the proximate lines are identified as the PROCESS LINE. There is a parallel line to the process line containing flow restrictor 270 identified as the BYPASS LINE.

Numerous control valves are unidentified, but their function is commonly known and their purpose in the system schematic will be readily evident to those skilled in the art.

The gas line is used to purge process chamber 250 after closure and sealing of the chamber loading mechanism. Trapped atmospheric air is removed in this manner. The gaseous $CO_2$ also can be used to charge the process chamber with $CO_2$ gas up to the pressure of storage tank 200.

Three supply lines are delivering supercritical $CO_2$: the co-solvent line, the surfactant line and the supercritical line. The supercritical state of $CO_2$ is established dynamically by heaters 212, 214, and 216 while $CO_2$ is flowing through the system. All lines following the heaters up to backpressure valves 252 and 254 are kept hot to maintain the supercritical state of $CO_2$. The system is shown with three heaters, one for each line, but a set-up can be designed with only one heater serving all three lines. The advantage of having individual heaters for each supercritical line will be evident from the explanation that follows.

Two of the three supercritical lines are designated to add co-solvent and surfactant, from tanks 222 and 224 respectively. In order to get these additives dissolved in $CO_2$, agitation is required. The agitation is provided by static mixers 218 and 220, located right before respective heaters 212 and 214. The function of the static mixers is to produce a colloidal mixture of $CO_2$ and the additive, which enables the additive to dissolve in the $CO_2$ that is being brought into the supercritical state by the heaters.

The supercritical line supplies only supercritical $CO_2$ to the chamber. By means of this line the chamber can be pressurized with supercritical $CO_2$ directly, thus avoiding the sample under process getting in contact with the liquid phase of $CO_2$. This is crucial for some applications, for example in the manufacturing of semiconductors where developed resist of very small size structures of about 100 nm (nano images) have to be cleaned. The supercritical phase $CO_2$ prevents the image from collapsing The liquid line allows supplying liquid $CO_2$ to the process chamber. A surfactant can be added to the liquid phase if required for the process, as is clearly indicated by the lines and valves of the figure. Static mixer 230 provides for proper agitation of a surfactant/$CO_2$ liquid mixture in the liquid line.

A process may require a well defined amount of additive to be added. In a continuous flow, steady state condition the flow rate of $CO_2$ is known and metering pumps 226 and 228 add the necessary amount of co-solvent or surfactant to the stream of liquid $CO_2$.

Prior to adding the additive, a steady state flow condition has to be achieved. The bypass line bypassing the process chamber is used for this purpose. The bypass line also can be used to precondition the surfactant and co solvent lines to achieve steady state flow condition and to add the respective additive to the $CO_2$ flow, while the chamber is being charged with, for example, supercritical $CO_2$ through the supercritical line.

Two separator vessels 256 and 258 on the downstream side of the chamber enable the system to run process and bypass lines simultaneously. The separator vessels separate the additives out at 257 and 259 respectively, from the $CO_2$. The separator vessels can double as discharge chambers for rapid decompression of chamber 250, as explained above.

$CO_2$ is vented to atmosphere at 260 but can as well be recycled in a closed loop system through bleed valve 262, gas regulator 264 and main gas feed valve 266.

Figure 4:
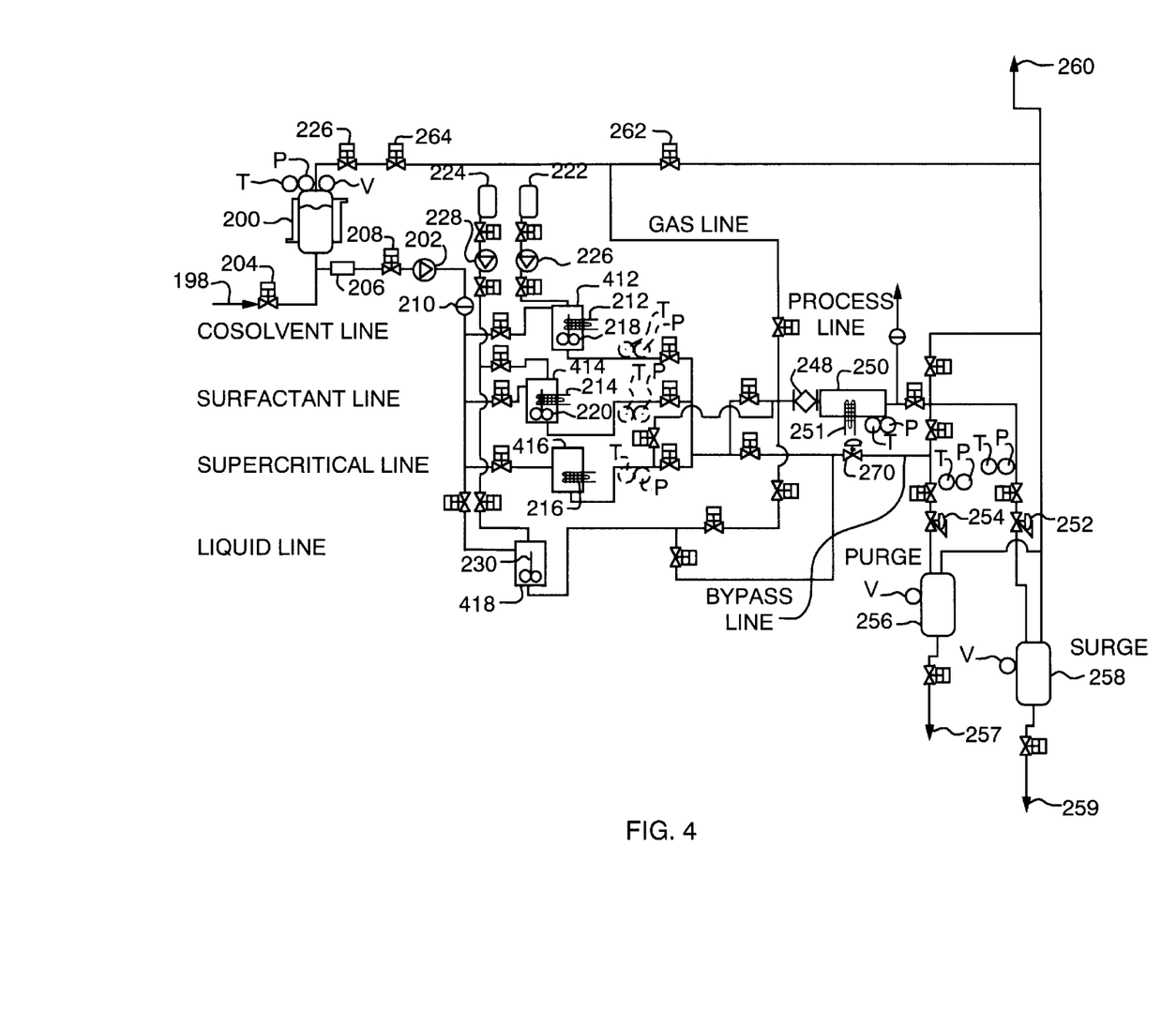
FIG. 4 is a diagrammatic presentation of a fourth embodiment of a delivery and recovery system of the invention.

Referring to FIG. 4, there is illustrated a fourth embodiment based on the one shown in FIG. 3, except that components are provided to enable the rapid injection and compression of process fluid into the chamber as described previously. In particular, in FIG. 4 there are again shown five $CO_2$ supply lines; (i) GAS LINE, (ii) COSOLVENT LINE, (iii) SURFACTANT LINE, (iv) SUPERCRITICAL LINE, and (v) LIQUID LINE.

In this embodiment heating of the $CO_2$ and mixing the $CO_2$ with co-solvents and surfactants or other materials is not done under dynamic flow conditions as described for the FIG. 3 embodiment. Instead, ballast tanks 412, 414, 416 and 418 are used to mix and heat the desired process fluid offline, which could be pure $CO_2$, or liquid and supercritical $CO_2$ with added co-solvents and surfactants or other materials. Depending on what type of process fluid has to be supplied to the chamber, the ballast tanks are equipped with respective heaters 212, 214, and 216, with mechanical agitators 218, 220, and 230, or with both.

The heaters in the ballast tanks of FIG. 4 can be external or internal heaters. The ballast tanks are equipped with means to measure pressure and temperature. The temperature reading is being used to control the heater power to achieve and maintain the desired temperature of the process liquid. In order to establish reproducible thermal conditions the ballast tank is insulated.

The following description of using the ballast tank applies to the supercritical lines, both co solvent and surfactant, but is similar for the other lines. To charge any of the ballast tanks, $CO_2$ is pumped into the selected ballast tank until the desired pressure is established. The respective heater transforms the contents, which still is pure $CO_2$ into its supercritical state. The desired amount of co-solvent or surfactant is being added directly to the ballast tank based on the known volume of the ballast tank. The respective mechanical agitator stirs the two fluids until the co-solvent or the surfactant has been solubilized in the supercritical $CO_2$. This charge will then be transferred to process chamber 250 by opening the inlet valve to the process chamber. The charging process can be interrupted when the desired pressure conditions in the process chamber are established.

Since under some circumstances, it may be desired to establish an equilibrium pressure between the selected ballast tank and process chamber 250, which is lower than the initial pressure in the ballast tank, and higher than the initial pressure in the process chamber, the ballast tank has to be of sufficient volume and initially charged with sufficiently higher pressure so as to then be discharged down to the desired equilibrium pressure in the chamber. It will be readily apparent that sufficiently high pressures in the ballast tanks which are closely coupled with the process chamber, will provide a very rapid compressive capability to the system.

After being thus charged, the chamber can be closed off and, for example, a soak step can follow in preparation for a chamber discharge step. During that time the used ballast tank can be emptied through the bypass line and be charged again for the next chamber filling or batch operation.

As described above, the concept of using ballast tanks in an otherwise continuous flow fluid supply and recovery system, provide a means to charge the process chamber rapidly with process fluid, which may have desirous effects for some processes.

In all embodiments the process chamber connected to or incorporated into the system is equipped with an internal heater, shown in FIG. 4 as heater 251, that allows varying the temperature in the chamber much more rapidly than with external heaters. By means of this feature, the process fluid can be brought into different states of matter, for example by crossing the phase boundary from the supercritical to the liquid state, at will. During that phase transition, agitation of the process fluid occurs, which may be beneficial to the processing task. The internal process chamber heater is configured to heat the materials under process from top and bottom.

The invention is capable of other and various embodiments, all within the scope of the claims. For example, there is a continuous flow fluid delivery and recovery system for supporting the operation of a supercritical phase process in a batch-operated process chamber, the principal components of which are:

(a) A pressurized fluid delivery system, including a process fluid supply system and pump for supplying a process fluid at a pre-process pressure, and a heater for heating and maintaining the process fluid under the pre-process pressure at a pre-process temperature. The pre-process pressure and temperature in combination can be selected and set to place the supply system process fluid in supercritical phase.

(b) A process byproducts recovery system for collecting byproducts of the process, where the recovery system includes means for recovering the process fluid from the byproducts and returning the process fluid to the process fluid supply system.

(c) The necessary components for controlling temperature within the process chamber, such as a liquid circulating heating and cooling subsystem, with inflow and outflow lines connecting the subsystem to at least one heat exchanger within the process chamber, preferably two, one under and one over the specimen under process. The subsystem and associated control valves for controlling flow in the heat exchanger, are controlled by the master computer control system for the delivery and recovery system. The invention is inclusive of other forms of heat control within the chamber, such as convection or radiation of all types from an emitter within or without the chamber.

(d) A process chamber inflow valve or manifold, and associated piping, for connecting the fluid delivery system to said process chamber for fluid flow.

(e) A process chamber outflow valve or manifold, and associated piping, for connecting the process chamber to the recovery system for fluid flow.

(f) A process chamber bypass valve or manifold, and associated piping, for connecting the fluid delivery system to the recovery system so as to bypass the process chamber.

(g) A computer control system and operator interface for controlling the pump, the process fluid heater, the means for controlling temperature within the process chamber, and the valves. The valves are operable so as to provide continuous flow of the process fluid in the delivery system, so that fluid at desired temperature and pressure is always flowing and available for injection into the process as required.

There may be included in the fluid delivery system one or more ballast tanks and ballast tank heaters for accumulating process fluid for rapid discharge into the process chamber. There may be in the recovery system a significant recovery volume, whether a large tank or in the extreme even an open exhaust port, connecting to the process chamber for receiving a rapid discharge of process byproducts from the process chamber so as to cause a very rapid decompression within the chamber. There would be provided recovery volume control valves for selecting and de-selecting the recovery volume from the rest of the recovery system; the recovery volume control valves being controlled by the computer control system.

The invention extends to a fluid delivery and recovery system in combination with at least one batch operated process chamber, where the supercritical phase process is the cleaning and processing of semiconductor wafers, and the opening, loading and unloading, and closing of the process chamber is controlled by the computer control system.

There may be in the delivery side of the system a ballast tank and ballast bypass control valve for permitting fluid flow to bypass the ballast tank, with the ballast bypass control valve being controlled by the computer control system.

There may also be in the fluid delivery system a condenser for condensing a process fluid from gas to a liquid, with at least one gas supply line connecting to the pressure chamber and a liquid supply line connecting to the chamber; the lines having respective chamber inflow control valves which are controlled by the computer control system.

As another example, there may be a continuous flow fluid delivery and recovery system that includes a process additive supply system and pump for supplying a process fluid additive to the process fluid, with a mixer for mixing the process fluid and the process fluid additive into a fluid mixture, and a heater for heating and maintaining the fluid mixture under the desired pre-process pressure at a desired pre-process temperature. It may also have the necessary recovery side components for recovering the process additives from the byproducts and returning the additives to the process additive supply system.

A further example of the invention includes a continuous flow fluid delivery and recovery system as above, with a condenser for condensing the process fluid gas to liquid, a process fluid gas supply line connecting to the process chamber, at least one fluid mixture supply line connecting to the process chamber and a liquid supply line connecting to the chamber; all lines having respective chamber inflow control valves or an equivalent manifold, all valves being controlled by the computer control system.

Yet another example of the system has a recovery system with at least two separators for separating byproducts gas from liquid and control valves associated therewith, where the control valves being operable to connect a first separator to the process chamber and a second separator to the chamber bypass valve so as to permit concurrent discharge, decompression or evacuation of the chamber, and bypass circulation from said fluid delivery system.

The objects and advantages of the invention may be further realized and attained by means of the instrumentalities and combinations particularly pointed out in the appended claims. Accordingly, the drawing and description are to be regarded as illustrative in nature, and not as restrictive.

We claim:

1. A continuous flow fluid delivery and recovery system for supporting the operation of a supercritical phase process in a batch-operated process chamber, comprising
   (a) a pressurized fluid delivery system including a process fluid supply system and pump for supplying a process fluid at a pre-process pressure, and a heater for heating and maintaining said process fluid under said pre-process pressure at a pre-process temperature, said pre-process pressure and said pre-process temperature in combination placing said process fluid in supercritical phase,
   (b) a process byproducts recovery system for collecting byproducts of said process, said recovery system including means for recovering said process fluid from said byproducts and returning said process fluid to said process fluid supply system,
   (c) means for controlling temperature within said process chamber,
   (d) a process chamber inflow valve for connecting said fluid delivery system to said process chamber for fluid flow,
   (e) a process chamber outflow valve for connecting said process chamber to said recovery system for fluid flow,
   (f) a process chamber bypass valve for connecting said fluid delivery system to said recovery system so as to bypass said process chamber, and
   (g) a computer control system controlling said pump, said heater, said means for controlling temperature within said process chamber, and said valves, said valves being operable so as to provide continuous flow of said process fluid in said delivery system.

2. A continuous flow fluid delivery and recovery system according to claim 1, said fluid delivery system further comprising a ballast tank and ballast tank heater for accumulating said process fluid for rapid discharge into said process chamber.

3. A continuous flow fluid delivery and recovery system according to claim 2, further comprising a ballast bypass control valve for permitting fluid flow to bypass said ballast tank, said ballast bypass control valve being controlled by said computer control system.

4. A continuous flow fluid delivery and recovery system according to claim 1, said recovery system further comprising a recovery volume connecting to said process chamber for receiving a rapid discharge of said process byproducts from said process chamber, and recovery volume control valves for selecting and de-selecting said recovery volume from said recovery system, said recovery volume control valves being controlled by said computer control system.

5. A continuous flow fluid delivery and recovery system according to claim 4, said byproducts recovery system further comprising at least one separator for separating process gas from liquid.

6. A continuous flow fluid delivery and recovery system according to claim 1, said means for controlling temperature with said process chamber comprising a liquid heating and cooling subsystem, inflow and outflow lines connecting said subsystem to at least one heat exchanger within said process chamber, and control valves for controlling flow in said heat exchanger, said subsystem and said control valves being controlled by said computer control system.

7. A continuous flow fluid delivery and recovery system according to claim 1, said process fluid being carbon dioxide.

8. A continuous flow fluid delivery and recovery system according to claim 1, in combination with at least one batch operated process chamber, said supercritical phase process being the cleaning and processing of semiconductor wafers, the opening, loading and unloading, and closing of said process chamber being controlled by said computer control system.

9. A continuous flow fluid delivery and recovery system according to claim 1, said fluid delivery system further comprising means for condensing a process fluid gas to a liquid, at least one gas supply line connecting to said pressure chamber and a liquid supply line connecting to said chamber, said lines having respective chamber inflow control valves, said respective chamber inflow control valves being controlled by said computer control system.

10. A continuous flow fluid delivery and recovery system for supporting the operation of a supercritical phase process in a batch-operated process chamber, comprising
   (a) a pressurized fluid delivery system including a process fluid supply system and pump for supplying a process fluid at a pre-process pressure, a process additive supply system and pump for supplying a process fluid additive to said process fluid, means for mixing said process fluid and said process fluid additive into a fluid mixture, and a heater for heating and maintaining said fluid mixture under said pre-process pressure at a pre-process temperature, said pre-process pressure and said pre-process temperature in combination placing said fluid mixture in supercritical phase,
   (b) a process byproducts recovery system for collecting byproducts of said process, said recovery system including means for recovering said process fluid from said byproducts and returning said process fluid to said process fluid supply system,
   (c) means for controlling temperature within said process chamber,
   (d) an inflow valve for connecting said fluid delivery system to said process chamber for fluid flow,
   (e) an outflow valve for connecting said process chamber to said recovery system for fluid flow, (f) a bypass valve for connecting said fluid delivery system to said recovery system so as to bypass said process chamber, and (g) a computer control system controlling said pump, said heater, said means for controlling temperature within said process chamber, and said valves, said valves being operable so as to provide continuous flow of said process fluid from said delivery system to said recovery system.

11. A continuous flow fluid delivery and recovery system according to claim 10, said fluid delivery system further comprising a ballast tank and ballast tank heater for accumulating said fluid mixture for rapid discharge into said process chamber.

12. A continuous flow fluid delivery and recovery system according to claim 11, further comprising a ballast bypass control valve for permitting fluid flow to bypass said ballast tank, said ballast bypass control valve being controlled by said computer control system.

13. A continuous flow fluid delivery and recovery system according to claim 10, said recovery system further comprising a recovery volume connecting to said process chamber for receiving a rapid discharge of said process byproducts from said process chamber, and recovery volume control valves for selecting and de-selecting said recovery volume from said recovery system, said recovery volume control valves being controlled by said computer control system.

14. A continuous flow fluid delivery and recovery system according to claim 13, said byproducts recovery system further comprising at least two separators for separating byproducts gas from liquid and control valves associated therewith, said control valves being operable to connect a first said separator to said process chamber and a second said separator to said chamber bypass valve so as to permit concurrent discharge of said chamber and bypass circulation from said fluid delivery system, said valves being controlled by said computer control system.

15. A continuous flow fluid delivery and recovery system according to claim 10, said recovery system further comprising means for recovering said process additives from said byproducts and returning said additives to said process additive supply system.

16. A continuous flow fluid delivery and recovery system according to claim 10, said means for controlling temperature with said process chamber comprising a liquid heating and cooling subsystem, inflow and outflow lines connecting said subsystem to at least one heat exchanger within said process chamber, and control valves for controlling flow in said heat exchanger, said subsystem and said control valves being controlled by said computer control system.

17. A continuous flow fluid delivery and recovery system according to claim 10, said process fluid being carbon dioxide.

18. A continuous flow fluid delivery and recovery system according to claim 10, in combination with at least one batch operated process chamber, said supercritical phase process being the cleaning and processing of semiconductor wafers, the opening, loading and unloading, and closing of said process chamber being controlled by said computer control system.

19. A continuous flow fluid delivery and recovery system according to claim 10, said fluid delivery system further comprising means for condensing said process fluid gas to liquid, a process fluid gas supply line connecting to said process chamber, at least one fluid mixture supply line connecting to said process chamber and a liquid supply line connecting to said chamber, all said lines having respective chamber inflow control valves, said respective chamber inflow control valves being controlled by said computer control system.

20. A continuous flow fluid delivery and recovery system in combination with at least one batch operated process chamber for the operation of a supercritical phase process, comprising (a) a pressurized fluid delivery system including a process fluid supply system and pump for supplying a process fluid at a pre-process pressure, a process additive supply system and pump for supplying a process fluid additive to said process fluid, means for mixing said process fluid and said process fluid additive into a fluid mixture, and a heater for heating and maintaining said fluid mixture under said pre-process pressure at a pre-process temperature, said pre-process pressure and said pre-process temperature in combination placing said fluid mixture in supercritical phase, (b) a process byproducts recovery system for collecting byproducts of said process, said recovery system including means for recovering said process fluid from said byproducts and returning said process fluid to said process fluid supply system, (c) means for controlling temperature within said process chamber, (d) an inflow valve for connecting said fluid delivery system to said process chamber for fluid flow, (e) an outflow valve for connecting said process chamber to said recovery system for fluid flow, (f) a bypass valve for connecting said fluid delivery system to said recovery system so as to bypass said process chamber, and (g) a computer control system controlling said pump, said heater, said means for controlling temperature within said process chamber, and said valves, said valves being operable so as to provide continuous flow of said process fluid from said delivery system to said recovery system, said recovery system further comprising means for recovering said process additives from said byproducts and returning said additives to said process additive supply system, said means for controlling temperature with said process chamber comprising a liquid heating and cooling subsystem, inflow and outflow lines connecting said subsystem to at least one heat exchanger within said process chamber, and control valves for controlling flow in said heat exchanger, said subsystem and said control valves being controlled by said computer control system, said process fluid being carbon dioxide, said supercritical phase process being the cleaning and processing of semiconductor wafers, and the opening, loading and unloading, and closing of said process chamber being controlled by said computer control system.

* * * * *